US009997706B2

(12) United States Patent
Kamplain et al.

(10) Patent No.: US 9,997,706 B2
(45) Date of Patent: *Jun. 12, 2018

(54) SEMICONDUCTOR NANOCRYSTALS AND METHODS OF PREPARATION

(71) Applicant: SAMSUNG RESEARCH AMERICA, INC., Mountain View, CA (US)

(72) Inventors: Justin W. Kamplain, Bartlesville, OK (US); Zhengguo Zhu, Chelmsford, MA (US)

(73) Assignee: SAMSUNG RESEARCH AMERICA, INC., Mountain View, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 13/913,108

(22) Filed: Jun. 7, 2013

(65) Prior Publication Data
US 2013/0273247 A1 Oct. 17, 2013

Related U.S. Application Data

(63) Continuation of application No. PCT/US2011/063919, filed on Dec. 8, 2011.

(60) Provisional application No. 61/421,164, filed on Dec. 8, 2010.

(51) Int. Cl.
| H01L 49/00 | (2006.01) |
| C30B 29/40 | (2006.01) |
| H01B 1/12 | (2006.01) |
| B82Y 40/00 | (2011.01) |
| H01L 21/02 | (2006.01) |
| B82Y 30/00 | (2011.01) |
| C09K 11/02 | (2006.01) |
| C09K 11/56 | (2006.01) |
| C09K 11/74 | (2006.01) |
| C09K 11/88 | (2006.01) |
| H01L 29/06 | (2006.01) |

(52) U.S. Cl.
CPC ............ *H01L 49/006* (2013.01); *B82Y 30/00* (2013.01); *B82Y 40/00* (2013.01); *C09K 11/02* (2013.01); *C09K 11/565* (2013.01); *C09K 11/7492* (2013.01); *C09K 11/883* (2013.01); *C30B 29/40* (2013.01); *H01L 21/0256* (2013.01); *H01L 21/02439* (2013.01); *H01L 21/02521* (2013.01); *H01L 21/02543* (2013.01); *H01L 21/02546* (2013.01); *H01L 21/02557* (2013.01); *H01L 21/02601* (2013.01); *H01L 21/02628* (2013.01); *H01L 21/02664* (2013.01); *H01L 29/0665* (2013.01); *Y10S 977/774* (2013.01); *Y10S 977/896* (2013.01)

(58) Field of Classification Search
None
See application file for complete search history.

(56) References Cited

U.S. PATENT DOCUMENTS

| 6,106,609 A | 8/2000 | Yang et al. |
| 6,322,901 B1 | 11/2001 | Bawendi et al. |
| 6,576,291 B2 | 6/2003 | Bawendi et al. |
| 7,147,712 B2 | 12/2006 | Zehnder et al. |
| 7,172,791 B2 | 2/2007 | Treadway et al. |
| 7,250,082 B2 | 7/2007 | Jang et al. |
| 7,288,468 B2 | 10/2007 | Jang et al. |
| 7,465,352 B2 | 12/2008 | Cao |
| 7,557,028 B1 | 7/2009 | Scher et al. |
| 7,621,997 B2 | 11/2009 | Jun et al. |
| 8,354,785 B2 | 1/2013 | Clough et al. |
| 9,136,428 B2 | 9/2015 | Clough et al. |
| 9,534,173 B2 | 1/2017 | Clough et al. |
| 2002/0066401 A1 | 6/2002 | Peng et al. |
| 2003/0010987 A1 | 1/2003 | Banin et al. |
| 2003/0097976 A1* | 5/2003 | Zehnder et al. ................ 117/68 |
| 2003/0173541 A1 | 9/2003 | Peng et al. |
| 2003/0209105 A1 | 11/2003 | Bawendi et al. |
| 2004/0022937 A1 | 2/2004 | Bonitatebus, Jr. et al. |
| 2005/0129947 A1 | 6/2005 | Peng et al. |
| 2006/0110313 A1 | 5/2006 | Cho et al. |
| 2006/0130741 A1 | 6/2006 | Peng et al. |
| 2006/0157720 A1* | 7/2006 | Bawendi et al. ................ 257/98 |

(Continued)

FOREIGN PATENT DOCUMENTS

| WO | WO2005022120 A2 | 3/2005 |
| WO | WO2009097319 A2 | 8/2009 |
| WO | WO2011100023 A1 | 8/2011 |
| WO | WO2012099653 A2 | 7/2012 |
| WO | WO2012099653 A3 | 7/2012 |

OTHER PUBLICATIONS

Hollingsworth, J.A., et al., "Low-Temperature, Solution-Based Routes to Nanocrystalline InS Powders and Thin Films", *MRS Proceedings*, (1998) 495, pp. 197-202.

(Continued)

*Primary Examiner* — Katie L Hammer
(74) *Attorney, Agent, or Firm* — Cantor Colburn LLP

(57) ABSTRACT

A method for preparing semiconductor nanocrystals is disclosed. The method comprises adding a precursor mixture comprising one or more cation precursors, one or more anion precursors, and one or more amines to a ligand mixture including one or more acids, one or more phenol compounds, and a solvent to form a reaction mixture, wherein the molar ratio of (the one or more phenol compounds plus the one or more acids plus the one or more amine compounds) to the one or more cations initially included in the reaction mixture is greater than or equal to about 6, and heating the reaction mixture at a temperature and for a period of time sufficient to produce semiconductor nanocrystals having a predetermined composition. Methods for forming a buffer layer and/or an overcoating layer thereover are also disclosed. Semiconductor nanocrystals and compositions including semiconductor nanocrystals of the invention are also disclosed. In certain embodiments, a semiconductor nanocrystal includes one or more Group IIIA and one or more Group VA elements.

22 Claims, 2 Drawing Sheets

(56) References Cited

U.S. PATENT DOCUMENTS

| | | |
|---|---|---|
| 2006/0202167 A1 | 9/2006 | Landry et al. |
| 2007/0049765 A1 | 3/2007 | Lucey et al. |
| 2007/0221121 A1 | 9/2007 | Zehnder et al. |
| 2007/0289491 A1 | 12/2007 | Peng et al. |
| 2008/0099728 A1 | 5/2008 | Jin et al. |
| 2008/0160306 A1 | 7/2008 | Mushtaq et al. |
| 2008/0202383 A1 | 8/2008 | Shi |
| 2008/0220593 A1 | 9/2008 | Pickett et al. |
| 2008/0247932 A1 | 10/2008 | Li et al. |
| 2008/0258159 A1 | 10/2008 | Jun et al. |
| 2009/0073349 A1 | 3/2009 | Park et al. |
| 2009/0162011 A1 | 6/2009 | Coe-Sullivan et al. |
| 2009/0230382 A1 | 9/2009 | Banin et al. |
| 2009/0278141 A1 | 11/2009 | Coe-Sullivan et al. |
| 2010/0052512 A1 | 3/2010 | Clough et al. |
| 2010/0068468 A1 | 3/2010 | Coe-Sullivan et al. |
| 2010/0090164 A1 | 4/2010 | Peng et al. |
| 2010/0159248 A1 | 6/2010 | Jang et al. |
| 2010/0265307 A1 | 10/2010 | Linton et al. |
| 2010/0283014 A1 | 11/2010 | Breen et al. |
| 2011/0140075 A1 | 6/2011 | Zhou et al. |
| 2011/0155969 A1 | 6/2011 | Bartel et al. |
| 2011/0223110 A1 | 9/2011 | Bartel et al. |
| 2011/0245533 A1 | 10/2011 | Breen et al. |
| 2012/0256134 A1 | 10/2012 | Nick |
| 2012/0256141 A1 | 10/2012 | Nick et al. |
| 2013/0009131 A1 | 1/2013 | Kazlas et al. |
| 2013/0037778 A1 | 2/2013 | Kazlas et al. |
| 2013/0069018 A1 | 3/2013 | Zhu et al. |
| 2013/0092886 A1 | 4/2013 | Kahen et al. |
| 2014/0227862 A1 | 8/2014 | Song et al. |
| 2014/0312286 A1 | 10/2014 | Kamplain |
| 2014/0322901 A1 | 10/2014 | Huang et al. |
| 2015/0166341 A1 | 6/2015 | Hamilton et al. |

OTHER PUBLICATIONS

Kortan, A.R., et al., "Nucleation and Growth of CdSe on ZnS Quantum Crystallite Seeds, and Vice Versa, in Inverse Micelle Media", *J. Amer. Chem. Soc.*, 1990, vol. 112, No. 4, 1327-1332.

Kumar, S. et al., "Synthesis and electrochemical properties of InP nanocrystals", *J. Mater. Res.*, (2006), vol. 21, No. 3, pp. 543-546.

Mićić, O.I.,et al., "Synthesis and Characterization of InP Quantum Dots", *J. Phys. Chem.* (1994), vol. 98, pp. 4966-4969.

Mićić, O.I.,et al., "Size-Dependent Spectroscopy of InP Quantum Dots", J. Phys. Chem. (1997) vol. 101, pp. 4904-4912.

Wells, R. et al., "Pathways to Nanocrystalline III-V (13-15) Compound Semiconductors" *Journal of Cluster Science* (1997) vol. 8, No. 2, pp. 217-238.

Xie, R., et al., "Colloidal InP Nanocrystals as Efficient Emitters Covering Blue to Near-Infrared", *J. Am. Chem. Soc.*, 2007, 129, pp. 15432-15433.

Xu, S., et al., "Rapid synthesis of highly luminescent InP and InP/ZnS nanocrystals", *J. Mater. Chem.*, 2008, 18, pp. 2653-2656.

Aharoni, et al., "Synthesis of InAs/CdSe/ZnSe Core/Shell1/Shell2 Structures with Bright and Stable Near-Infrared Fluorescence", *J. Am. Chem. Soc.* (2006), vol. 128, pp. 257-264.

Allen, et al., "InAs(ZnCdS) Quantum Dots Optimized for Biological Imaging in the Near-Infrared" J. Am. Chem. Soc. (2010), vol. 132, No. 2, pp. 470-471.

Allen, et al., Supporting Information, pp. S1-S8, for: "InAs(ZnCdS) Quantum Dots Optimized for Biological Imaging in the Near-Infrared" J. Am. Chem. Soc. (2010), vol. 132, No. 2, pp. 470-471.

Cao, et al., "Synthesis and Characterization of InAs/InP and InAs/CdSe Core/Shell Nanocrystals" *Angew. Chem. Int. Ed.* (1999), vol. 38, No. 24, pp. 3692-3694.

Cizeron, et al., "Solid Solution of $Cd_xZn_{1-y}S$ Nanosized Particles: Photophysical Properties" *J. Phys. Chem. B* (1997) vol. 101, pp. 8887-8891.

Guzelian, et al., "Colloidal chemical synthesis and characterization of InAs nanocrystal quantum dots" *Appl. Phys. Lett.* (1996) vol. 69, No. 10, pp. 1432-1434.

Haubold, et al., "Strongly Luminescent InP/ZnS Core—Shell Nanoparticles" *ChemPhysChem* (2001), No. 5, pp. 331-334.

Hollingsworth, et al., "Soft Chemical Synthesis and Manipulation of Semiconductor Nanocrystals", *Semiconductor and Metal Nanocrystals: Synthesis and Electronic and Optical Properties*, Klimov, ed. 2004, Marcel Dekker, pp. 1-64.

Kim; S-W, et al., "Engineering $InAs_xP_{1-x}$/InP/ZnSe III-V Alloyed Core/Shell Quantum Dots for the Near-Infrared" J. Am. Chem. Soc. (2005), vol. 127, pp. 10526-10532.

Lee, S. et al., "Brightening, Blinking, Bluing and Bleaching in the Life of a Quantum Dot: Friend or Foe", *ChemPhysChem*, (2009), 10, 2174-2191.

Li, L., et al., "One-pot Synthesis of Highly Luminescent InP/ZnS Nanocrystals without Precursor Injection", *J. Am. Chem. Soc.* (2008), vol. 130 (35), pp. 11588-11589.

Murray et al., Synthesis and characterization of nearly monodisperse CdE (E=S, Se, Te) semiconductor nanocrystallites , *J. Am. Chem. Soc.*, (1993) vol. 115, pp. 8706-8715.

Murray, C., "Synthesis and Characterization of II-VI Quantum Dots and Their Assembly into 3-D Quantum Dot Superlattices", Thesis, Massachusetts Institute of Technology, Sep. 1995.

PCT Search Report and Written Opinion dated Aug. 31, 2012 for International Application No. PCT/US2011/063919, which is the parent of this case.

Ryu, et al., "Step-Wise Synthesis of InP/ZnS Core Shell Quantum Dots and the Role of Zinc Acetate", *Chem. Mater.* (2009), vol. 21, No. 4, pp. 573-575.

Trikalitis, et al., "Mesostructured cobalt and nickel molybdenum sulfides", *Microporous and Mesoporous Materials* (online), vol. 88, Iss. 1-3, pp. 187-190.

Xie, et al., "Synthetic Scheme for High-Quality InAs Nanocrystals Based on Self-Focusing and One-Pot Synthesis of InAs-Based Core-Shell Nanocrystals" *Angew. Chem. Int. Ed.* (2008), vol. 47, pp. 7677-7680.

Xie, et al., Supporting Information, 6 pgs., for: "Synthetic Scheme for High-Quality InAs Nanocrystals Based on Self-Focusing and One-Pot Synthesis of InAs-Based Core-Shell Nanocrystals" *Angew. Chem. Int. Ed.* (2008), vol. 47, pp. 7677-7680.

Xie, et al., "InAs/InP/ZnSe Core/Shell/Shell Quantum Dots as Near-Infrared Emitters: Bright, Narrow-Band, Non-Cadmium Containing, and Biocompatible" *Nano Res* (2008), vol. 1, pp. 457-464.

Xu, et al., "Rapid Synthesis of High-Quality InP Nanocrystals" *J. Am. Chem. Soc.* (2006), vol. 128, No. 4, pp. 1054-1055.

Zimmer, et al., "Size Series of Small Indium Arsenide—Zinc Selenide Core—Shell Nanocrystals and Their Application to In Vivo Imaging" *J. Am. Chem. Soc.* (2006) vol. 128, pp. 2526-2527.

Zimmer, et al., Supporting Information, pp. 1-10, for: "Size Series of Small Indium Arsenide—Zinc Selenide Core—Shell Nanocrystals and Their Application to In Vivo Imaging" *J. Am. Chem. Soc.* (2006), vol. 128, pp. 2526-2527.

Battaglia, D., et al., "Formation of High Quality InP and InAs Nanocrystals in a Noncoordinating Solvent", Nano Letters (2002) Vo. 2, No. 9, pp. 1027-1030.

PCT Search Report and Written Opinion dated Apr. 12, 2011 for International Application No. PCT/US2010/059931, which claims priority to U.S. Appl. No. 13/572,012, 17 pages.

\* cited by examiner

Absorption and PL spectra of InAs/CdSe/CdZnS QDs

SEMICONDUCTOR NANOCRYSTALS AND METHODS OF PREPARATION

This application is a continuation of International Application No. PCT/US2011/063919, filed 8 Dec. 2011, which was published in the English language as PCT Publication No. WO 2012/099653 on 26 Jul. 2012, which International Application claims priority to U.S. Application No. 61/421,164, filed 8 Dec. 2010. Each of the foregoing is hereby incorporated herein by reference in its entirety.

FEDERALLY SPONSORED RESEARCH OR DEVELOPMENT

This invention was made with Government support under Contract No. 2004*H838109*000 awarded by the Central Intelligence Agency. The Government has certain rights in the invention.

TECHNICAL FIELD OF THE INVENTION

The present invention relates to the technical field of nanotechnology, and more particularly to semiconductor nanocrystals and methods for preparing same.

SUMMARY OF THE INVENTION

In accordance with one aspect of the present invention, there is provided a method for preparing semiconductor nanocrystals, the method comprising: adding a precursor mixture comprising one or more cation precursors, one or more anion precursors, and one or more amines to a ligand mixture including one or more acids, one or more phenol compounds, and a solvent to form a reaction mixture, wherein the molar ratio of (the one or more phenol compounds plus the one or more acids plus the one or more amine compounds) to the one or more cations initially included in the reaction mixture is greater than or equal to about 6, and heating the reaction mixture at a temperature and for a period of time sufficient to produce semiconductor nanocrystals having a predetermined composition.

In certain embodiments, at least one cation precursor comprises a Group III cation precursor and at least one anion precursor comprises a Group V anion precursor.

In certain preferred embodiments, the molar ratio of cation precursor(s) to anion precursor(s) in the precursor mixture is greater than 1. In certain of such embodiments, the molar ratio is in a range from greater than 1 to about 3. In certain embodiments the ratio is 2:1. Other ratios may be determined to be useful or desirable.

In certain embodiments, at least one of the one or more amine compounds comprises a primary amine. In certain embodiments, at least one of the one or more amine compounds comprises a secondary amine. In certain embodiments, at least one of the one or more amine compounds comprises a tertiary amine. In certain embodiments including one or more amine compounds, a mixture of amines can be included.

In certain embodiments, one or more phenol compounds comprise a monocyclic phenol or a polycyclic phenol.

In certain embodiments, at least one or the one or more phenol compounds comprises a mixture of two or more different phenol compounds.

In certain embodiments, one or more of the acids included in the mixture comprise a carboxylic acid compound.

In certain embodiments, each of the one or more acids comprises a carboxylic acid compound.

In certain embodiments including one or more carboxylic acid compounds in the mixture, at least one of the one or more carboxylic acid compounds further comprises one or more alkyl groups.

In certain embodiments including a carboxylic acid compound in the mixture, at least one of the one or more carboxylic acid compounds comprises $CH_3(CH_2)_nC(O)OH$ wherein n=1-18.

In certain embodiments including one or more carboxylic acid compounds in the mixture, at least one of the one or more carboxylic acid compounds further comprises one or more aromatic groups.

In certain embodiments, the precursor mixture further includes a solvent. In certain of such embodiments, a solvent can comprise a mixture of solvents. In certain of such embodiments, a solvent comprises a weakly coordinating solvent. In certain of such embodiments, a solvent comprises a non-coordinating solvent.

In certain embodiments, the precursor mixture is formed without heating. For example, in certain embodiments, the precursors can be admixed at room temperature. Preferably the precursor mixture is not heated or subjected to heat prior to being added to the reaction mixture to avoid nucleation prior to addition.

In certain embodiments, the molar ratio of (the one or more phenol compounds plus the one or more acids plus the one or more amine compounds) to the one or more cations is greater than about 10.

In certain embodiments, the molar ratio of (the one or more phenol compounds plus the one or more acids plus the one or more amine compounds) to the one or more cations is in a range from about 6 to about 20.

In certain embodiments, the molar ratio of (the one or more phenol compounds plus the one or more acids plus the one or more amine compounds) to the one or more cations is in a range from about 10 to about 15.

In certain embodiments, the reaction mixture temperature is in a range from about 150° C. to about 300° C.

In certain embodiments including a cation precursor comprising indium and an anion precursor comprising arsenic, the ligand mixture is at a temperature greater than or equal to about 250° C. when the precursor mixture is added thereto.

In certain embodiments, the method can further comprise isolating the nanocrystals from the reaction mixture.

In certain embodiments, the semiconductor nanocrystals in accordance with the invention comprise semiconductor nanocrystals that are capable of emitting light with a peak emission wavelength in a range from about 800 nm to about 2 microns upon excitation.

In certain embodiments, the semiconductor nanocrystals in accordance with the invention comprise semiconductor nanocrystals that are capable of emitting light with a peak emission wavelength in a range from about 1 micron to about 2 microns upon excitation.

In accordance with another embodiment of the present invention, the method can further comprise introducing additional ligand mixture and additional precursor mixture to the reaction mixture to grow the particles to a predetermined particle size, wherein the molar ratio of (the one or more phenol compounds plus the one or more acids plus the one or more amine compounds) to the one or more cations introduced into the reaction mixture during such growth is greater than or equal to about 6.

In certain embodiments, additional ligand mixture and additional precursor mixture is added in an incremental manner.

In certain embodiments, additional ligand mixture and additional precursor mixture is added in a continuous manner.

In certain embodiments, additional ligand mixture and additional precursor mixture is added in a semi-continuous manner.

Additional ligand mixture and additional precursor mixture are preferably introduced separately. In certain of such embodiments, additional ligand mixture and additional precursor mixture are added concurrently. Such additions are preferably at a predetermined rate.

In certain embodiments, additional ligand mixture and additional precursor mixture can be introduced separately, with additional ligand mixture being added prior to each introduction of additional precursor mixture.

In certain preferred embodiments, the molar ratio of cation(s) precursor to anion precursor in additional precursor mixture is greater than 1. In certain of such embodiments, the molar ratio is in a range from greater than 1 to about 3. In certain embodiments the ratio is 2:1. Other ratios may be determined to be useful or desirable.

In certain embodiments, the method can further comprise forming a buffer layer comprising a semiconductor material over a portion of the outer surface of the semiconductor nanocrystal.

In certain embodiments, forming the buffer layer comprises adjusting the temperature of the reaction mixture to a second temperature, adding buffer anion precursors and buffer cation precursors, and reacting the buffer precursors to form the semiconductor material. In certain of such embodiments, the buffer anion precursors and buffer cation precursors are not mixed together prior to addition.

In certain embodiments, the buffer layer does not completely cover the outer surface of the semiconductor nanocrystal on which it is formed.

Examples of semiconductor materials for inclusion in a buffer layer include, but are not limited to, Group II-VI compounds, Group III-V compounds, etc. Other non-limiting examples of semiconductor materials for inclusion in a buffer layer are described below. Other semiconductor materials may be used.

In certain preferred embodiments, the semiconductor nanocrystals are not isolated from the reaction mixture prior to forming the buffer layer.

In certain embodiments, the method further comprises forming an overcoating layer over the outer surface of a semiconductor nanocrystal.

In certain embodiments, a buffer layer is included on a portion of the outer surface of a semiconductor nanocrystal prior to forming an overcoating layer thereover.

In certain embodiments, forming an overcoating layer comprises adding overcoating anion precursors and overcoating cation precursors to the reaction mixture, and reacting the overcoating precursors to form the semiconductor material.

In certain embodiments, the overcoating precursors are not mixed together prior to addition.

In certain embodiments, each of the overcoating precursors are added at a predetermined rate, which may be the same or different.

In certain preferred embodiments, the semiconductor nanocrystals are not isolated prior to forming an overcoating layer.

In certain of such preferred embodiments, no additional acid, phenols, or amines are added in the overcoating step.

In certain of such preferred embodiments, it may be determined to be useful or desirable to add additional acid, phenols, amines, and/or mixtures thereof.

In accordance with another aspect of the present invention, there are provided semiconductor nanocrystals prepared in accordance with methods of the invention described in this application.

In accordance with another aspect of the present invention, there are provided compositions comprising semiconductor nanocrystals prepared in accordance with methods of the invention described in this application.

As used herein, "phenol compound" refers to any compound that includes at least one six-membered aromatic ring that is bonded directly to a hydroxyl group (—OH).

As used herein, an "amine compound" refers to any organic compounds that contains at least one basic nitrogen atom with a lone electron pair or compound that includes an organic functional group that contains at least one basic nitrogen atom with a lone electron pair.

As used herein, a "phosphonic acid compound" refers to a compound including at least one phosphonic acid group.

As used herein, a "carboxylic acid compound" refers to a compound including at least one carboxylic acid group.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

Additional information concerning the foregoing, and other information useful with the present inventions is provided below.

It is to be understood that both the foregoing general description and the following detailed description are exemplary and explanatory only and are not restrictive of the invention as claimed. Other embodiments will be apparent to those skilled in the art from consideration of the description and drawings, from the claims, and from practice of the invention disclosed herein.

DETAILED DESCRIPTION OF THE INVENTION

Figure 1:
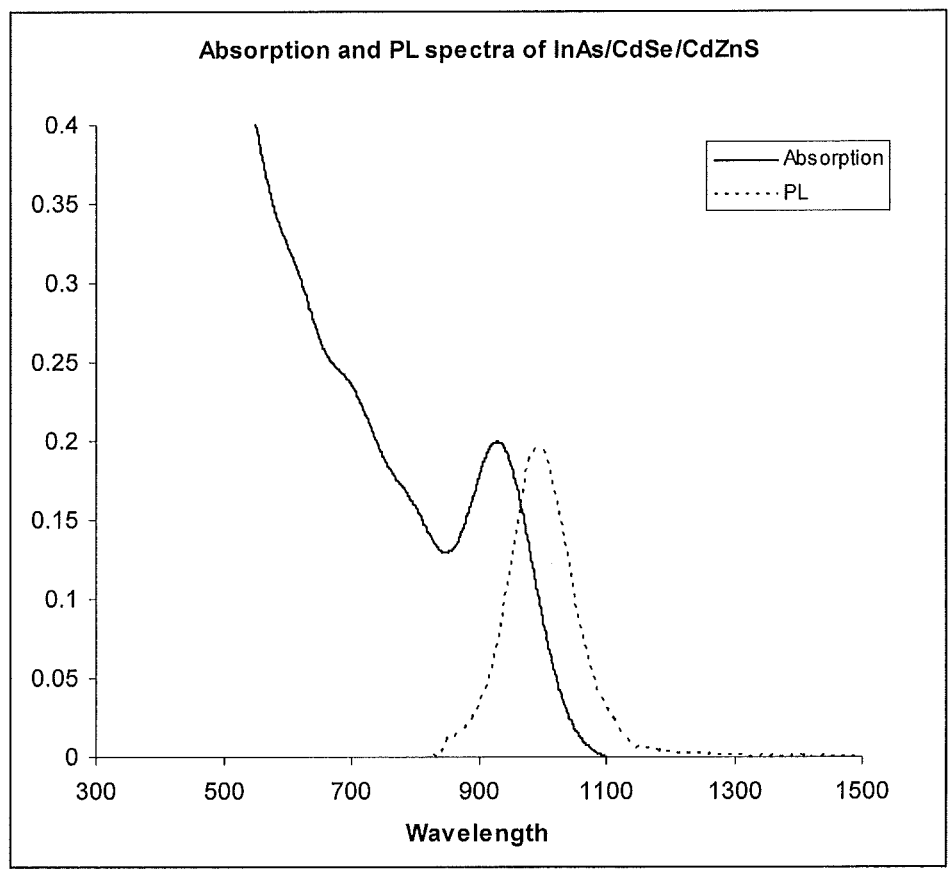
FIGS. 1 and 2 graphically depict data relating to various examples described in the specification.

Various aspects and embodiments of the present inventions will be further described in the following detailed description.

The present invention relates to methods for preparing semiconductor nanocrystals. The present invention further relates to semiconductor nanocrystals. The present invention further also relates to compositions comprising semiconductor nanocrystals.

In accordance with one aspect of the present invention, there is provided a method for preparing semiconductor nanocrystals, the method comprising adding a precursor mixture comprising one or more cation precursors, one or more anion precursors, and one or more amines to a ligand mixture including one or more acids, one or more phenol compounds, and a solvent to form a reaction mixture, wherein the molar ratio of (the one or more phenol compounds plus the one or more acids plus the one or more amine compounds) to the one or more cations that are initially included in the reaction mixture is greater than or equal to about 6, and heating the reaction mixture at a temperature and for a period of time sufficient to produce semiconductor nanocrystals having a predetermined composition.

Examples of amine compounds include, but are not limited to, primary amines, e.g., $CH_3(CH_2)_nNH_2$ wherein n=5-19 (e.g., hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, eicosylamine), secondary amines, e.g., $(CH_3(CH_2)_n)_2NH$ wherein n=3-11 (e.g., dibutylamine, dipentylamine, dihexylamine, diheptylamine, dioctylamine, dinonylamine, didecylamine, didundecylamine, didodecylamine), tertiary amines, e.g., $(CH_3(CH_2)_n)_3N$ wherein n=3-11 (e.g., tributylamine, tripentylamine, trihexylamine, triheptylamine, trioctylamine, trinonylamine, tridecylamine, triundecylamine, tridodecylamine), and mixtures including one or more different amines. In certain embodiments, an amine comprises decylamine, octadecylamine, and/or oleylamine. Other amines may also be determined to be useful or desirable by one of ordinary skill in the art.

Examples of phenol compounds includes, for example, but are not limited to, resorcinol or hydroquinone, bisphenol F, bisphenol A, 2,2'-dihydroxybenzophenone, 2,4-di-tert-butylphenol, 2-phenylphenol, 2,6-diphenylphenol, 2,6-dimethyl phenol, and 2,3-dimethyl phenol. Other phenols may also be determined to be useful or desirable by one of ordinary skill in the art.

In certain embodiments, one or more phenol compounds comprise a monocyclic phenol or a polycyclic phenol.

In certain embodiments, at least one or the one or more phenol compounds comprises a mixture of two or more different phenol compounds.

In certain embodiments, one or more of the acids included in the mixture comprise a carboxylic acid compound.

In certain embodiments, each of the one or more acids comprises a carboxylic acid compound.

In certain embodiments including one or more carboxylic acid compounds in the mixture, at least one of the one or more carboxylic acid compounds further comprises one or more alkyl groups.

In certain embodiments including a carboxylic acid compound in the mixture, at least one of the one or more carboxylic acid compounds comprises $CH_3(CH_2)_nC(O)OH$ wherein n=1-18.

In certain embodiments including one or more carboxylic acid compounds in the mixture, at least one of the one or more carboxylic acid compounds further comprises one or more aromatic groups.

Examples of carboxylic acid compounds for use in the method include, but are not limited to, $CH_3(CH_2)_nC(O)OH$ wherein n=6-18 (e.g., octanoic [caprylic] acid, nonanoic [pelargonic] acid, decanoic [capric] acid, undecanoic acid, dodecanoic [lauric] acid, tridecanoic acid, tetradecanoic [myristic] acid, pentadecanoic acid, hexadecanoic [palmitic] acid, heptadecanoic [margaric] acid, octadecanoic [stearic] acid, nonadecanoic acid, eicosanoic [arachidic] acid). In certain embodiments, a carboxylic acid compound comprises oleic acid. Other carboxylic acid compounds for use in the method can be identified by one of ordinary skill in the art.

Other acids may also be determined to be useful or desirable by one of ordinary skill in the art.

In certain embodiments, the precursor mixture comprising one or more cation precursors, one or more anion precursors, and one or more amines further includes a solvent.

A solvent for inclusion in the precursor mixture and/or the ligand mixture can comprise a single solvent or a mixture of solvents.

In certain embodiments, a solvent comprises a non-coordinating solvent.

Examples of non-coordinating solvents for use in the methods taught herein include, but are not limited to, squalane, octadecane, or any other saturated hydrocarbon molecule. Mixtures of two or more solvents can also be used. Other non-coordinating solvents for use in the methods taught herein can be readily ascertained by one of ordinary skill in the art. In certain embodiments, non-coordinating solvents comprise liquids having a dipole moment in the range form 0 to about 0.2 μ/D.

In certain embodiments, a solvent comprises a weakly coordinating solvent. Examples of weakly coordinating solvents include, for example, but are not limited to aromatic ether or solvent mixtures including an aromatic ether, e.g., DowTherm A. In certain embodiments, weakly coordinating solvents comprise liquids having a dipole moment in the range from 0.2 to 0.7 μ/D. Other non-coordinating solvents and weakly coordinating solvents compatible with the reaction conditions and that will not react with the semiconductor nanocrystals or ligands can be identified by one of ordinary skill in the art.

In certain embodiments, the molar ratio of (the one or more phenol compounds plus the one or more acids plus the one or more amine compounds) to the one or more cations initially included in the reaction mixture is greater than about 10.

In certain embodiments, the molar ratio of (the one or more phenol compounds plus the one or more acids plus the one or more amine compounds) to the one or more cations initially included in the reaction mixture is in a range from about 6 to about 20.

In certain, the molar ratio of (the one or more phenol compounds plus the one or more acids plus the one or more amine compounds) to the one or more cations initially included in the reaction mixture is in a range from about 10 to about 15.

In certain embodiments including a cation precursor comprises indium and an anion precursor comprises arsenic, for example, the molar ratio of (the one or more phenol compounds plus the one or more acids plus the one or more amine compounds) to the one or more cations initially included in the reaction mixture is preferably greater than 10, more preferably greater than 12.

Other ratios may also be determined to be useful or desirable by one of ordinary skill in the art.

In certain embodiments, one or more additional ligands in addition to ligands included in the ligand mixture can be included in the reaction mixture. Other ligands are discussed elsewhere herein.

In certain embodiments, the reaction mixture temperature is in a range from about 150° C. to about 300° C.

In certain embodiments, the reaction mixture temperature is in a range from about 180° C. to about 300° C.

In certain embodiments, the wherein the reaction mixture temperature is in a range from about 270° C. to about 300° C.

Other temperatures may also be determined to be useful or desirable.

Preferably the temperature is maintained substantially constant during the preparation of the semiconductor nanocrystals.

Preferably the temperature of the precursor mixture prior to introduction into the reaction mixture is at room temperature or a temperature that is below room temperature, but above the freezing point of the mixture.

In certain embodiments, the reaction is carried out in an inert atmosphere, where exposure to air is substantially, and preferably completely, precluded.

In certain of such embodiments, the method can further include isolating the nanocrystals from the reaction mixture.

In certain embodiments, the method comprises a method for preparing semiconductor nanocrystals comprising one or more Group III elements and one or more Group V elements. In certain of such embodiments, the method comprises, the method comprising: combining one or more Group III cation precursors, one or more Group V anion precursors, one or more ligands, one or more amine compounds, and a first solvent without heating to form a precursor mixture; adding the precursor mixture to a ligand mixture to form a reaction mixture, the ligand mixture comprising one or more acids, one or more phenol compounds, and a second solvent, wherein the molar ratio of (the one or more phenol compounds plus the one or more acid compounds plus the one or more amine compounds) to the one or more cations initially included in the reaction mixture is greater than or equal to about 6, wherein at the time of precursor mixture addition, the ligand mixture is at a temperature sufficient to initiate reaction of one or more Group III cation precursors with one or more of the Group V anion precursors.

Semiconductor nanocrystals prepared by the methods described herein can comprise one or more semiconductor materials. Examples of semiconductor materials include, but are not limited to, Group II-VI compounds (e.g., binary, ternary, and quaternary compositions), Group II-V compounds (e.g., binary, ternary, and quaternary compositions), Group III-VI compounds (e.g., binary, ternary, and quaternary compositions), Group III-V compounds (e.g., binary, ternary, and quaternary compositions), Group IV-VI compounds (e.g., binary, ternary, and quaternary compositions), Group compounds (e.g., binary, ternary, and quaternary compositions), Group II-IV-VI compounds (e.g., binary, ternary, and quaternary compositions), Group II-IV-V compounds (e.g., binary, ternary, and quaternary compositions), Group IV elements, and alloys including any of the foregoing, and/or a mixture including any of the foregoing. Semiconductor nanocrystals can also comprise one or more semiconductor materials that comprise ternary and quaternary alloys that include one or more of the foregoing compounds.

A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture or alloy including any of the foregoing, including ternary and quaternary mixtures or alloys. Non-limiting examples of such alloys and/or mixtures include CdZnS, CdZnSe, InGaP, InPAs, and In GaAs.

As used herein, "cation" refers to a metal element (e.g., a Group I (e.g., Cu, Ag, Au), Group II (e.g., Mg, Zn, Cd, Hg), Group III (e.g., B, Al, Ga, In, Tl), or Group IV (e.g., Si, Ge, Sn, Pb) element) included in a semiconductor nanocrystal; wherein the valence of the element can include zero. As used herein, "anion" refers to a non-metal element (e.g., a Group V (e.g., N, P, As, Sb, Bi) or Group VI (e.g., O, S, Se, Te) element) included in a semiconductor nanocrystal); wherein the valence of the element can include zero.

The size and composition of a semiconductor nanocrystal affects its characteristic spectral emission wavelength. Thus, the size and composition of a semiconductor nanocrystal is readily selected by one of ordinary skill in the art such that the semiconductor nanocrystal emits photons at a predetermined wavelength in the desired portion of the spectrum.

In certain embodiments, a semiconductor nanocrystal can comprise a semiconductor material comprising one or more elements of Group III (e.g., B, Al, Ga, In, Tl) and one or more elements of Group V (e.g., N, P, As, Sb, Bi) (e.g., binary, ternary, and quaternary III-V compositions).

Examples of metal cation precursors include elements, covalent compounds, ionic compounds, and/or coordination complexes, that serve as a source for the desired metal element(s) in the resulting nanocrystal. For example, a metal cation precursor can constitute a wide range of substances, including, but not limited to, a metal oxide, a metal carbonate, a metal bicarbonate, a metal sulfate, a metal sulfite, a metal phosphate, metal phosphite, a metal halide, a metal carboxylate, a metal alkoxide, a metal thiolate, a metal amide, a metal imide, a metal alkyl, a metal aryl, other organometallics, a metal coordination complex, a metal solvate, and the like. For example, non-limiting examples of indium precursors include In(III) acetate, In(III) trifluoroacetate, trialkyl indium $(InR_3)$(wherein R=methyl, ethyl, propyl, butyl, pentyl, hexyl, isopropyl, isobutyl, test-butyl, etc.); non-limiting examples of gallium precursors include Ga(III) acetate, Ga(III) trifluoroacetate, trialkyl gallium $(InR_3)$(wherein R=methyl, ethyl, propyl, butyl, pentyl, hexyl, isopropyl, isobutyl, tert-butyl, etc.). Other Group III cation precursors can be readily ascertained by one of ordinary skill in the art.

Examples of anion precursors include elements, covalent compounds, or ionic compounds that serve as a source for a non-metallic element(s) in the resulting nanocrystal. Non-metallic precursors are most often selected from the elements themselves (oxidation state 0), covalent compounds, or ionic compounds of the non-metallic elements. For example, non-limiting examples of phosphorus precursors include $P(SiR_3)_3$ wherein R=methyl, ethyl, propyl, butyl, pentyl, hexyl, isopropyl, isobutyl, tert-butyl, etc.); non-limiting examples of arsenic precursors include $As(SiR_3)_3$ wherein R=methyl, ethyl, propyl, butyl, pentyl, hexyl, isopropyl, isobutyl, tert-butyl, etc.). Other Group V precursors can be readily ascertained by one of ordinary skill in the art.

In certain embodiments, semiconductor nanocrystals comprising binary materials, ternary materials, quaternary materials, and even more complex species may be prepared using the methods described herein, in which case more than one cation precursor and/or more than one anion precursor may be included.

In certain embodiments, a semiconductor nanocrystal can include a semiconductor material comprising one or more elements of Group III and one or more elements of Group V (e.g., binary, ternary, and quaternary III-V compositions).

In certain embodiments, a semiconductor nanocrystal can include a semiconductor material comprising one or more elements of Group II and one or more elements of Group VI (e.g., binary, ternary, and quaternary II-VI compositions).

A semiconductor nanocrystal may also be referred to herein as a semiconductor nanoparticle, a nanocrystal, a quantum dot or a QD.

A semiconductor nanocrystal is capable of emitting light upon excitation. A semiconductor nanocrystal can be excited by irradiation with an excitation wavelength of light, by electrical excitation, or by other energy transfer.

The emission from a semiconductor nanocrystal can be a narrow Gaussian emission band that can be tuned through the complete wavelength range of the ultraviolet, visible, or infra-red regions of the spectrum by varying the size of the semiconductor nanocrystal, the composition of the semiconductor nanocrystal, or both.

In certain embodiments, the semiconductor nanocrystals of the invention comprise semiconductor nanocrystals that are capable of emitting light with a peak emission wavelength in a range from about 800 nm to about 2 microns upon excitation.

In certain embodiments, the semiconductor nanocrystals of the invention comprise semiconductor nanocrystals that are capable of emitting light with a peak emission wavelength in a range from about 1 micron to about 2 microns upon excitation.

Photoluminescence quantum efficiency (also referred to as quantum efficiency, quantum yield or solution quantum yield) represents the percent of absorbed photons that are reemitted as photons upon excitation by irradiation with an excitation wavelength of light.

A nanocrystal is a nanometer sized particle, e.g., in the size range of up to about 1000 nm. In certain embodiments, a nanocrystal can have a size in the range of up to about 100 nm. In certain embodiments, a nanocrystal can have a size in the range up to about 20 nm (such as about 1, 2, 3, 4, 5, 6, 7, 8, 9, 10, 11, 12, 13, 14, 15, 16, 17, 18, 19, or 20 nm). In certain embodiments, a nanocrystal can have a size less than 100 Å.

In certain embodiments, the method further comprise introducing additional amounts of ligand mixture and additional amounts of precursor mixture to the reaction mixture to increase or grow the size of the of the seed particles to a predetermined particle size, wherein the molar ratio of (the one or more phenol compounds plus the one or more acids plus the one or more amine compounds) to the one or more cations introduced into the reaction mixture during such growth is greater than or equal to about 6.

In certain embodiments, additional ligand mixture and additional precursor mixture is added in an incremental manner. For example, in certain of such embodiments, the additional ligand mixture and additional precursor mixture can be added as a series of incremental additions.

In certain embodiments, additional ligand mixture and additional precursor mixture is added in a continuous manner.

In certain embodiments, additional ligand mixture and additional precursor mixture is added in a semi-continuous manner.

Additional ligand mixture and additional precursor mixture are preferably introduced separately. In certain of such embodiments, additional ligand mixture and additional precursor mixture are added concurrently. Such additions are preferably at a predetermined rate.

In certain embodiments, additional ligand mixture and additional precursor mixture can be introduced separately, with additional ligand mixture being added prior to each introduction of additional precursor mixture.

Preferably, the molar ratio of cation(s) precursor to anion precursor in additional precursor mixture is greater than 1.

In certain of such embodiments, the molar ratio is in a range from greater than 1 to about 3. In certain embodiments the ratio is 2:1. Other ratios may be determined to be useful or desirable.

Preferably the temperature of the additional precursor mixture prior to introduction into the reaction mixture is at room temperature or a temperature that is below room temperature, but above the freezing point of the mixture.

Temperatures useful for the reaction mixture during preparing of nanocrystals described above can also be used during introduction of additional ligand mixture and additional precursors to grow the nanocrystals. Other temperatures may also be determined to be useful or desirable.

Preferably the temperature is maintained substantially constant during the preparation of the semiconductor nanocrystals.

In certain embodiments, a semiconductor nanocrystal prepared in accordance with the present invention (prior to further inclusion of a buffer layer and/or an overcoating layer), has a size in a range from about 2 to about 10 nanometers, from about 2 to about 8 nanometers, from about 2 to about 4 nanometers, etc. Other sizes can also be prepared.

The size of a nanocrystal can be determined, for example, by direct transmission electron microscope measurement. Other known techniques can also be used to determine nanocrystal size.

Nanocrystals can have various shapes. Examples of the shape of a nanocrystal include, but are not limited to, sphere, rod, disk, tetrapod, other shapes, and/or mixtures thereof.

As discussed above, the method can further include formation of a buffer layer and/or an overcoating layer.

In certain embodiments, the method can further comprise forming a buffer layer comprising a semiconductor material over a portion of the outer surface of the semiconductor nanocrystal.

Preferably the nanocrystals are not isolated from the reaction mixture and the buffer layer is formed on the nanocrystals "in situ".

In certain embodiments, forming a buffer layer comprises adjusting the temperature of the reaction mixture to a second temperature, adding buffer anion precursors and buffer cation precursors, and reacting the buffer precursors to form the semiconductor material.

In certain embodiments, the temperature of the reaction mixture is adjusted to a second temperature prior to adding the precursor materials for forming the buffer layer.

In certain embodiments, the second temperature is lower than the temperature of the reaction mixture during preparation of the semiconductor nanocrystals.

In certain embodiments wherein the buffer layer comprises a II-VI compound, the second temperature is less than 250° C., and preferably less than 200° C. In certain of such embodiments, the temperature is about 180° C. Other temperatures may, however, be determined to be useful or desirable.

In certain of such embodiments, the buffer anion precursors and buffer cation precursors are not mixed together prior to addition.

Semiconductor materials described herein can be included in a buffer layer.

Precursors for forming semiconductor materials that are described elsewhere in this application can be used in forming the buffer layer.

Each of the precursors may be included in a solvent prior to being added to the dispersion of nanocrystals over which a buffer layer is to be formed.

Solvents can comprise solvents described elsewhere in the application. Other solvents may also be determined to be useful or desirable.

In certain preferred embodiments, the buffer layer does not completely cover the outer surface of the semiconductor nanocrystal on which it is formed.

Preferably the buffer layer is no thicker than a monolayer.

Examples of semiconductor materials for inclusion in a buffer layer include, but are not limited to, Group II-VI compounds, Group III-V compounds, etc. Other non-limiting examples of semiconductor materials for inclusion in a buffer layer are described below. Other semiconductor materials may be used.

Preferably the buffer layer has a composition that is different from the composition of the nanocrystal over which it is disposed.

In certain embodiments, the method can further comprise forming an overcoating layer over the outer surface of a semiconductor nanocrystal.

In certain embodiments, a buffer layer is optionally included on a portion of the outer surface of a semiconductor nanocrystal prior to forming an overcoating layer thereover.

In certain embodiments, forming an overcoating layer comprises adding overcoating anion precursors and overcoating cation precursors to a dispersion of the nanocrystals to be overcoated, and reacting the overcoating precursors to form an overcoating material.

In certain preferred embodiments, the overcoating comprises a semiconductor material. More preferably such semiconductor material is different from the semiconductor material of the core nanocrystal and the buffer layer.

Preferably the nanocrystals are not isolated from the reaction mixture and the buffer layer is formed on the nanocrystals "in situ".

In certain of such preferred embodiments, no additional acid, phenols, or amines are added in the overcoating step.

In certain of such preferred embodiments, it may be determined to be useful or desirable to add additional acid, phenols, amines, and/or mixtures thereof.

In certain embodiments, the overcoating precursors are not mixed together prior to addition.

In certain embodiments, each of the overcoating precursors are added at a predetermined rate, which may be the same or different from each other.

In certain embodiments, the overcoating precursors are added to the dispersion including nanocrystals to be overcoated, which dispersion is at a first overcoating temperature, and the temperature is then adjusted to a second overcoating temperature to grow the overcoating material to a predetermined thickness.

In certain embodiments, the first overcoating temperature is in a range from about 150° C. to about 200° C. In certain embodiments, 180° C. can be preferred.

The second overcoating temperature is preferably higher than the first overcoating temperature.

In certain embodiments, the second overcoating temperature is greater than 200° C., and preferably in a range from about 220° C. to about 280° C. In certain embodiments, 260° C. can be preferred.

After the desired overcoating layer is formed, the temperature of the growth medium is cooled to room temperature.

In certain preferred embodiments, the reaction vessel is transferred to a dry box using standard air-free techniques.

In accordance with another aspect of the present invention, there are provided semiconductor nanocrystals prepared in accordance with methods of the invention described in this application.

As discussed above, the method can further include formation of a buffer layer and/or an overcoating layer.

In certain embodiments, the buffer layer and or overcoating layer (which may also be referred to herein as a "shell") comprise one or more semiconductor materials.

In certain embodiments, the one or more semiconductor materials are different from the semiconductor material included in the nanocrystal core.

In embodiments further including a buffer layer and an overcoating layer, the one or more semiconductor materials included in each is different from the semiconductor material included in the other.

In certain embodiments, an overcoating layer can comprise two or more layers of the same or different semiconductor materials. In certain embodiments, a layer can include a single semiconductor material or a mixture of two or more semiconductor materials with different compositions, particle sizes, and/or emission characteristics. A semiconductor material may comprise a compound, a doped compound, and/or an alloy. A nanocrystal core surrounded by a shell is also referred to as having a "core/shell" structure.

Examples of semiconductor materials for inclusion in a buffer layer and/or overcoating layer include, but are not limited to, a semiconductor material comprising one or more elements of Group II and one or more elements of Group VI (e.g., binary, ternary, and quaternary II-VI compositions). Other non-limiting examples of semiconductor materials include a semiconductor material comprising one or more elements of Group III and one or more elements of Group V (e.g., binary, ternary, and quaternary III-V compositions), Group IV-VI compounds (e.g., binary, ternary, and quaternary compositions), Group compounds (e.g., binary, ternary, and quaternary compositions), Group II-IV-VI compounds (e.g., binary, ternary, and quaternary compositions), Group II-IV-V compounds (e.g., binary, ternary, and quaternary compositions), Group IV elements, an alloy including any of the foregoing, and/or a mixture including any of the foregoing.

Overcoating thickness can be varied by growing a desired thickness of overcoating material. For example, an overcoating layer can have a thickness of at least one monolayer or more than about one monolayer. Preferably, the thickness is less than that at which quantum confinement is not achieved. The thickness is selected to achieve the predetermined characteristics of the core/shell nanocrystal. In certain embodiments, the thickness is in the range from greater than about 1 to about 20 monolayers. In certain embodiments, the thickness is in the range from greater than about 1 to about 10 monolayers. In certain embodiments, the thickness is in the range from greater than about 1 to about 5 monolayers. In certain embodiments, the thickness is in the range from about 1 to about 5 monolayers. In certain embodiments, the thickness is in the range from about 3 to about 5 monolayers. In certain embodiments, more than 20 monolayers can be grown. In certain embodiments, the overcoating layer has a thickness from about 2 to about 2.5 monolayers.

In certain embodiments, a nanocrystal includes a shell or overcoating layer formed over at least a portion, and preferably all, of the outer surface thereof.

As mentioned above, in certain embodiments, the nanocrystal can be isolated from the reaction mixture prior to optionally forming a buffer layer and/or overcoating layer thereover. In certain of such embodiments, isolated nanocrystals can be purified before a buffer layer and/or overcoating layer is formed.

In certain preferred embodiments, the formation of the buffer layer and overcoating layer is carried out in the same reaction vessel in which the core nanocrystal is formed.

In certain embodiments, a nanocrystal further includes one or more ligands attached to the surface of the nanocrystal. Such ligands can be derived from the reaction mixture during growth of the nanocrystal.

In certain embodiments, a nanocrystal core, and/or a nanocrystal shell comprises a colloidal growth process. Colloidal growth occurs by injection a cation precursor and an anion precursor into a hot solvent. This permits discrete nucleation and results in the controlled growth of macroscopic quantities of nanocrystals. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals.

In certain embodiments, the population of nanocrystals that can be obtained has a narrow, monodisperse distribution of particle sizes. The distribution of particle sizes can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in size and more preferably less than 10% rms and most preferably less than 5%.

A narrow size distribution of the nanocrystals comprising semiconductor material allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 for "Highly Luminescent Color-Selective Materials" (now U.S. Pat. No. 6,322,901). The foregoing documents are hereby incorporated herein by reference in their entireties.

As mentioned above, a cation precursor can be an inorganic compound, an organometallic compound, or elemental metal. For example, in preparing a semiconductor material represented by the general formula MX, wherein the semiconductor material comprises one or more Group III cation precursors (represented by M in the above general formula), M comprises one or more of boron, aluminum, gallium, indium, and thallium. Additional chemical elements can optionally be further included. In preparing other semiconductor materials, the cation precursor is selected based on the composition of the desired semiconductor material. The anion precursor is a compound capable of reacting with the cation precursor to form a material with the general formula MX. For example, in preparing a semiconductor material comprising a Group V, element, X comprises one or more of nitrogen, phosphorus, arsenic, antimony, or bismuth. In preparing other semiconductor materials, X is selected based on the composition of the desired semiconductor material. For example, X donor can be a chalcogenide (Group VI) donor or a pnictide (Group V) donor, such as a phosphine chalcogenide, a bis(silyl) chalcogenide, dioxygen, an ammonium salt, or a tris(silyl) pnictide. Examples of suitable X donors include, but are not limited to, dioxygen, bis(trimethylsilyl) selenide (($TMS)_2Se$), octadecene-Se, trialkyl phosphine selenides such as (tri-n-octylphosphine) selenide (TOPSe) or (tri-n-butylphosphine) selenide (TBPSe), octadecene-Te, trialkyl phosphine tellurides such as (tri-n-octylphosphine) telluride (TOPTe) or hexapropylphosphorustriamide telluride (HPPTTe), bis(trimethylsilyl)telluride (($TMS)_2Te$), octadecene-S, bis(trimethylsilyl)sulfide (($TMS)_2S$), a trialkyl phosphine sulfide such as (tri-n-octylphosphine) sulfide (TOPS), an ammonium salt such as an ammonium halide (e.g., NH4Cl), tris(trimethylsilyl) phosphide (($TMS)_3P$), tris(trimethylsilyl) arsenide (($TMS)_3As$), or tris(trimethylsilyl) antimonide (($TMS)_3Sb$). In certain embodiments, the M donor (e.g., cation precursor) and the X donor (e.g., anion precursor) can be moieties within the same molecule.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals as well as to sharpen size distribution. For example, by stopping growth at a particular semiconductor nanocrystal average diameter, a population having an average semiconductor nanocrystal diameter of less than 150 Å can be obtained. A population of nanocrystals can have an average diameter of 15 Å to 125 Å. In addition, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

Optionally, the particle size distribution of the nanocrystals can be further refined by size selective precipitation with a poor solvent for the nanocrystals, such as, for example, methanol/butanol. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population preferably has no more than a 15% rms deviation from mean particle size, more preferably 10% rms deviation or less, and most preferably 5% rms deviation or less.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

As discussed herein, nanocrystals can further include other ligands attached thereto in addition to those derived from the one or more acids, phenols, and amines included in the reaction mixture. Ligands can optionally be exchanged after growth, if desired.

Examples of ligands include, but are not limited to, fatty acids and other carboxylic acid compounds, phosphonic acid compounds, amine compounds, phosphines, phosphine oxides, etc.

Examples of solvents include, but are not limited to, octadecene, squalene, methyl myristate, octyl octanoate, hexyl octanoate, and $CH_3(CH_2)_nC(O)O(CH_2)_mCH_3$ wherein n=4-18 and m=1-8, dioctyl ether, and diphenyl ether, and mixtures of one or more solvents. In certain embodiments, a mixture can comprise a mixture, (including but not limited to a eutectic mixture) of biphenyl and diphenyl oxide, including, e.g., DOWTHERM A, available from the Dow Chemical Company. Other high boiling point ethers (e.g., BP>~200° C.) may also be used. Such ethers can be aromatic ethers, aliphatic ethers or aromatic aliphatic ethers. Examples of additional ethers include, but are not limited to, dihexyl ether, diethyleneglycol dimethyl ether, diethyleneglycol dibutyl ether, triethyleneglycol dimethyl ether, tetraethyleneglycol dimethyl ether, butyl phenyl ether, benzyl phenyl ether, dibenzyl ether, ditolyl ether and isomers thereof. Mixtures of two or more solvents can also be used. Other solvents can be readily ascertained by one of ordinary skill in the art.

In certain embodiments, trioctyl phosphine (TOP) can be used as a solvent.

Examples of non-coordinating solvents for use in the methods taught herein include, but are not limited to, squalane, octadecane, or any other saturated hydrocarbon molecule. Mixtures of two or more solvents can also be used. Other non-coordinating solvents for use in the methods taught herein can be readily ascertained by one of ordinary skill in the art. In certain embodiments, non-coordinating solvents comprise liquids having a dipole moment in the range form 0 to about 0.2 μ/D. In certain embodiments, weakly coordinating solvents can be used. In certain embodiments, weakly coordinating solvents comprise liquids having a dipole moment in the range from 0.2 to 0.7 μD.

Coordinating solvents (e.g., TOP, etc.) can also be included in formation of a buffer layer and/or overcoating layer.

In certain embodiments, the reaction is carried out in an inert atmosphere, where exposure to air is substantially, and preferably completely, precluded.

The present invention will be further clarified by the following non-limiting examples, which are intended to be exemplary of the present invention.

EXAMPLES

Example 1

Synthesis of NIR Emitting Quantum Dots

InAs Core Growth:
In a 5 port, 500 mL, reactor add:
1) 100 mL of Squalane (Aldrich, fresh from solvent purification system).
2) 12.0 g of 2,3-dimethyl phenol (F.W. 122.16; Aldrich, 99%).
3) 13.5 g of myristic acid (F. W. 228.37, Aldrich, Kosher grade).

The 500 mL reactor is equipped with a manual stirrer and thermocouple. The remaining 3 ports are sealed with rubber septa. The stirring is turned on (set to 260 rpm) and the reactor placed under vacuum for 1 hour. After degassing, the reactor is backfilled with $N_2$ and heated to 285° C. using a heating mantle. Once the reactor has stabilized at 285° C. the stirring is adjusted to 400 rpm and the InAs core precursors are added via syringe in one portion:

InAs precursors for core growth:
Dissolve 2.71 g of Trimethyl Indium (F.W. 159.93 Rohm and Haas, Optograde), 4.81 g dioctyl amine (F.W. 241.46, Aldrich, 98%, freshly distilled), 2.48 g of Trimethyl silyl arsine (F.W. 249.49, Nanomeps) in 45 mL of Dow Therm A (Eutectic mixture of biphenyl and diphenyl ether, freshly prepared and thoroughly degassed).

After injection the reaction is monitored via UV/Vis/NIR absorption spectroscopy to monitor the progress of the core growth. Once the $1^{st}$ excitonic peak for the InAs nanocrystals has reached 790-800 nm the reaction is cooled to 180° C. and a 100 fold dilution of the crude core mixture is analyzed via UV/Vis/NIR absorption spectroscopy.

The stir rate is reduced to 333 rpm for the shelling process.

CdSe Buffer Layer Growth:
1) 1.38 mL of 2M Trioctyl phosphine ligated Selenium (F.W. 78.96, Strem, 99.99%) is dissolved in 20 mL of trioctylphosphine (TOP) (F.W. 370.60, Strem,). This is added in one portion to the InAs core reaction and maintained at 180° C. for 10 minutes.
2) 2.75 mL of 0.5M Cd-Oleate (In house prepared)/Oleic Acid (F. W. 282.46, Aldrich, Tech. Grade) solution is added in one portion to the 500 mL reactor and the solution is maintained at 180° C. for 30 minutes.

CdZnS Outer Shell Growth:
1) 2.33 g of dimethyl cadmium (F.W. 142.88, Strem) and 2.02 g of diethyl zinc (F.W. 123.49, Strem) are dissolved in 80 mL of TOP.
2) Separately, 5.84 g of $(TMS)_2$-S (F. W. 178.44, Aldrich, Synthesis Grade) is dissolved in is dissolved in 80 mL of TOP.

The slow addition of CdZnS shell precursor solutions to the 500 mL reactor is started at 180° C. and allowed to add to the reactor for 10 minutes (40 mL/hour). The reactor is then heated to 260° C. for the duration of the overcoating procedure (approximately 2 hours). The reaction is then cooled to room temperature and transferred to the dry box using standard air-free techniques.

InAs/CdSe/CdZnS Isolation:
The reaction mixture (circa 450 mL) is diluted with 2-propanol (IPA, fresh from solvent purification system) to a total volume of 2 L to induce flocculation of the InAs based nanoparticles. The mixture is centrifuged (3000 rpm/45 minutes) and the supernatant is discarded. The oily residue is triturated with fresh IPA and the resulting black slurry isolated via centrifugation (4000 rpm, 2 minutes). The black solids are re-suspended in hexanes (circa 150 mL) and filtered through a 0.4 μM filter. The colloidal InAs/CdSe/CdZnS quantum dot solution is then stored under stored under inert atmosphere.

Semiconductor nanocrystals (also referred to herein as "QDs") prepared generally in accordance with Example 1 can provide PL of approximately 1000 nm+50, with a FWHM of about 100-130, and a PLQY of about 40-70%, as shown in FIG. 1.

Example 2

Synthesis of NIR Emitting Quantum

InAs Core Growth:

In a 5 port, 500 mL, reactor add:
1) 200 mL of Squalane (Aldrich, fresh from solvent purification system).
2) 12.0 g of 2,3-dimethyl phenol (F.W. 122.16; Aldrich, 99%).
3) 13.5 g of myristic acid (F. W. 228.37, Aldrich, Kosher grade).

The 500 mL reactor is equipped with a manual stirrer and thermocouple. The remaining 3 ports are sealed with rubber septa. The stirring is turned on (set to 260 rpm) and the reactor placed under vacuum for 1 hour. After degassing, the reactor is backfilled with $N_2$ and heated to 285° C. using a heating mantle. Once the reactor has stabilized at 285° C. the stirring is adjusted to 400 rpm and the InAs core precursors are added via syringe in one portion:

InAs precursors for core growth:

Dissolve 2.71 g of Trimethyl Indium (F.W. 159.93 Rohm and Haas, Optograde), 4.81 g dioctyl amine (F.W. 241.46, Aldrich, 98%, freshly distilled), 2.48 g of Trimethyl silyl arsine (F.W. 249.49, Nanomeps) in 45 mL of Dow Therm A (Eutectic mixture of biphenyl and diphenyl ether, freshly prepared and thoroughly degassed).

After injection the reaction allowed to stir at 285° C. for three hours.

Growth of Large InAs cores:

Additional ligand mixture and additional precursor mixture are added to the InAs core after 3 hrs of initial core growth. The additional Indium and Arsenic precursor mixture is added slowly via syringe pump over 1.5 hours. Additional ligand mixture is added in a single portion at three times during the slow addition of additional precursor mixture: at 0 min, 30 minutes, and 60 minutes. At the end of the addition, the 1 excitonic absorption feature should reach 1010-1025 nm via UV/Vis/NIR absorption spectroscopy. This size regime is ideal for continuing on with the shell growth procedure.

Additional InAs Precursors and Ligands to Grow Large Core:
1) Organometallic precursor solution: 8.13 g of Trimethyl Indium, 14.43 g dioctyl amine, 7.44 g Trimethyl silyl arsine are dissolved in 180 mL of Dow Therm A.
2) Ligand stock solution: 40.5 g Myristic Acid, 36 g 2,3-dimethyl Phenol, 45 mL of Squalane (vacuum/purged 3 times after melted and kept under N2).

Figure 2:
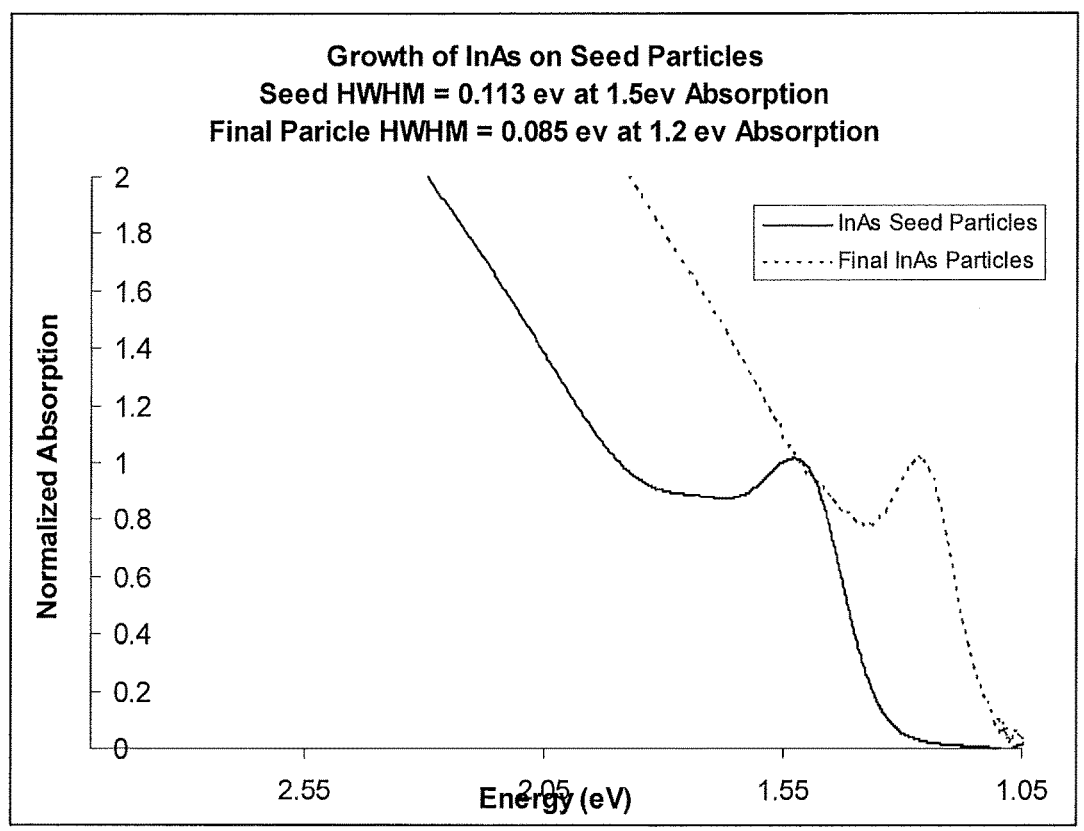

FIG. 2 shows a comparison of InAs particles before and after additional growth.

The half-width at half maximum of the first excitonic absorption shown in FIG. 2 is narrower for the final (larger) particles than for the seed particles from which the final particles are prepared. This is indicative of the final particles having a narrower size distribution than that of the starting seed particles.

Example 3

InAs semiconductor nanocrystals can be overcoated to provide a variety of wavelengths, including wavelengths greater than 1 micron. Semiconductor nanocrystal prepared generally in accordance with the procedure described in Example 2 are overcoated as follows without prior isolation.

CdZnS Outer Shell Growth (90% Cd/10% Zn):

1) 11.262 g of dimethyl cadmium (F.W. 142.88, Strem) and 1.08 g of diethyl zinc (F.W. 123.49, Strem) are dissolved in 200 mL of TOP.
2) Separately, 12.67 g of $(TMS)_2$-S (F. W. 178.44, Aldrich, Synthesis Grade) is dissolved in is dissolved in 200 mL of TOP.

The slow addition of CdZnS shell precursor solutions to the 500 mL reactor is started at 180° C. and allowed to add to the reactor for 10 minutes (40 mL/hour). 2 mL of Oleic Acid (distilled in dry box) is added and the reactor is then heated to 260° C. for the duration of the overcoating procedure (approximately 2 hours), The reaction is then cooled to room temperature and transferred to the dry box using standard air-free techniques.

The QDs are comprised of an InAs core surrounded by a semiconductor shell(s) of ZnS, CdZnS, or CdSe/CdZnS. The shell in this case possesses a wider bandgap confining the wavefunction of the excited state electron hole pair in the photoexcited core. A third, organic layer surrounds the semiconductor shell which prevents QDs from interacting and subsequently deactivating.

In another aspect of the present invention, there is provided a composition including the semiconductor nanocrystals taught herein.

In certain embodiments, the composition can comprise a particle, composition, formulation, powder, coatings, etc. described in International Application No. PCT/US2010/48285, of QD Vision, Inc., for "Particles Including Nanoparticles, Uses Thereof, And Methods", filed 9 Sep. 2010, which is hereby incorporated herein by reference in its entirety.

In certain embodiments, the composition can comprise a formulation, coating, powder, composition, formulations, raw batch formulation, etc. described in International Application No. PCT/US2010/48291, of QD Vision, Inc., for "Formulations Including Nanoparticles", filed 9 Sep. 2010, which is hereby incorporated herein be reference in its entirety.

Additional information that may be useful with the present invention is included in International Application No. PCT/US2007/13152 of Coe-Sullivan, et al., for "Light-Emitting Devices and Displays With Improved Performance", filed 4 Jun. 2007; International Application No. PCT/US2008/007901 of Linton, et al., for "Compositions And Methods Including Depositing Nanomaterial", filed 25 Jun. 2008; International Application No. PCT/US2009/002123 filed 3 Apr. 2009 of QD Vision, Inc. for "Light-Emitting Device Including Quantum Dots", International Application No. PCT/US2010/51867 of QD Vision, Inc., filed 7 Oct. 2010, and International Application No. PCT/US2010/56397 of QD Vision, Inc., filed 11 Nov. 2010, and International Application No. PCT/US2007/024320, of QD Vision, Inc., for "Nanocrystals Including A Group Ma Element And A Group Va Element, Method, Composition, Device And Other Products", filed 21 Nov. 2007. The disclosures of each of the foregoing applications are hereby incorporated herein by reference in their entireties.

As used herein, the singular forms "a", "an" and "the" include plural unless the context clearly dictates otherwise. Thus, for example, reference to an emissive material includes reference to one or more of such materials.

The entire contents of all patent publications and other publications cited in this disclosure are hereby incorporated herein by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. A method for preparing semiconductor nanocrystals, the method comprising:
    adding a precursor mixture comprising one or more cation precursors, one or more anion precursors, and one or more amine compounds, wherein at least one cation precursor comprises a Group III cation precursor and at least one anion precursor comprises a Group V anion precursor, to a ligand mixture including one or more acids, one or more phenol compounds, and a solvent to form a reaction mixture, wherein the molar ratio of (the one or more phenol compounds plus the one or more acids plus the one or more amine compounds) to the one or more cations initially included in the reaction mixture is greater than or equal to about 6, and
    heating the reaction mixture at a temperature and for a period of time sufficient to produce semiconductor nanocrystals having a predetermined composition, wherein the semiconductor nanocrystals include ligands attached thereto, wherein the ligands are derived from the one or more acids, the one or more phenol compounds, and the one or more amine compounds included in the reaction mixture.

2. A method in accordance with claim 1 wherein the one or more phenol compounds comprise a monocyclic phenol or a polycyclic phenol.

3. A method in accordance with claim 1 wherein the precursor mixture is prepared without heating.

4. A method in accordance with claim 1 wherein the precursor mixture further includes a precursor mixture solvent.

5. A method in accordance with claim 1 wherein the one or more acids comprise a carboxylic acid compound.

6. A method in accordance with claim 1 wherein the molar ratio of (the one or more phenol compounds plus the one or more acids plus the one or more amine compounds) to the one or more cations is greater than about 10.

7. A method in accordance with claim 1 wherein the molar ratio of (the one or more phenol compounds plus the one or more acids plus the one or more amine compounds) to the one or more cations is in a range from about 6 to about 20.

8. A method in accordance with claim 5 wherein the carboxylic acid compound comprises $CH_3(CH_2)_n—C(O)OH$ wherein n=1-18.

9. A method in accordance with claim 5 wherein the carboxylic acid compound further comprises one or more aromatic groups.

10. A method in accordance with claim 1 wherein at least one of the one or more phenol compounds comprises a mixture of two or more different phenol compounds.

11. A method in accordance with claim 1 wherein the reaction mixture temperature is in a range from about 150° C. to about 300° C.

12. A method in accordance with claim 1 further comprising isolating the nanocrystals from the reaction mixture.

13. A method in accordance with claim 1 wherein the semiconductor nanocrystals comprise semiconductor nanocrystals that are capable of emitting light with a peak emission wavelength in a range from about 800 nm to about 2 microns upon excitation.

14. A method in accordance with claim 1 further comprising:
    forming a buffer layer comprising a second semiconductor material over a portion of the outer surface of the semiconductor nanocrystals.

15. A method in accordance with claim 14 wherein forming the buffer layer comprises adjusting the temperature of the reaction mixture to a second temperature, separately adding one or more buffer anion precursors and one or more buffer cation precursors, and reacting the buffer precursors to form the second semiconductor material.

16. A method in accordance with claim 14 wherein the semiconductor nanocrystals are isolated from the reaction mixture prior to forming the buffer layer.

17. A method in accordance with claim 14 wherein the second semiconductor material comprises a II-VI semiconductor material.

18. A method in accordance with claim 1 further comprising:
    forming an overcoating layer over the outer surface of the semiconductor nanocrystals.

19. A method in accordance with claim 18 wherein no additional acids, phenol compounds, or amine compounds are added in the overcoating step.

20. A method in accordance with claim 18 wherein the method further comprises:
    forming a buffer layer comprising a second semiconductor material over a portion of the outer surface of the semiconductor nanocrystals prior to forming the overcoating layer.

21. A method in accordance with claim 1 wherein the molar ratio of cation to anion in the precursor mixture is greater than 1.

22. A method in accordance with claim 1 wherein the anion precursor comprises an ionic compound or a covalent compound that serves as a source for a Group V anion.

* * * * *